United States Patent
Kim et al.

(10) Patent No.: US 11,081,777 B2
(45) Date of Patent: Aug. 3, 2021

(54) ANTENNA ASSEMBLY AND DEVICE INCLUDING ANTENNA ASSEMBLY

(71) Applicant: KMW INC., Hwaseong-si (KR)

(72) Inventors: Duk Yong Kim, Hwaseong-si (KR); Bae Mook Jeong, Hwaseong-si (KR); Chang Woo Yoo, Hwaseong-si (KR)

(73) Assignee: KMW INC., Hwaseong-si (KR)

( * ) Notice: Subject to any disclaimer, the term of this patent is extended or adjusted under 35 U.S.C. 154(b) by 0 days.

(21) Appl. No.: 16/586,912

(22) Filed: Sep. 28, 2019

(65) Prior Publication Data

US 2020/0028237 A1 Jan. 23, 2020

Related U.S. Application Data

(63) Continuation of application No. PCT/KR2018/003841, filed on Apr. 2, 2018.

(30) Foreign Application Priority Data

Mar. 31, 2017 (KR) .................... 10-2017-0042127

(51) Int. Cl.
  H01Q 1/22 (2006.01)
  H01Q 1/42 (2006.01)
  (Continued)

(52) U.S. Cl.
  CPC .............. H01Q 1/22 (2013.01); H01Q 1/42 (2013.01); H01R 13/646 (2013.01); H04B 1/03 (2013.01);
  (Continued)

(58) Field of Classification Search
  CPC .. H01Q 1/22; H01Q 1/42; H01Q 1/02; H01Q 21/0093; H01Q 3/267; H01R 13/646;
  (Continued)

(56) References Cited

U.S. PATENT DOCUMENTS 6,329,949 B1 * 12/2001 Barnett ................. H01Q 1/246
                                                   333/202
8,941,539 B1    1/2015 Bharghavan et al.
(Continued)

FOREIGN PATENT DOCUMENTS

EP          1133064 A1    9/2001
KR    10-2013-0122761 A  11/2013
(Continued)

OTHER PUBLICATIONS

International Search Report for PCT/KR2018/003841 dated Jun. 28, 2018 and its English translation.

*Primary Examiner* — Awat M Salih

(57) ABSTRACT

An antenna assembly and an antenna device including the same are provided. The antenna assembly includes antenna elements, a first printed circuit board (PCB), cavity filters, and a second PCB. The first PCB has one surface provided with the antenna elements. The cavity filters are installed on the other surface of the first PCB and electrically connected to the plurality of antenna elements. The second PCB has one surface electrically connected to the cavity filters and includes at least a power amplifier, digital processing circuit, and calibration network. The second PCB includes one or more first processing areas and one or more second processing areas extending in parallel with each other. The digital processing circuit is disposed in the second processing area and not in the first processing area. The power amplifier is disposed in the first processing area and not in the second processing area.

10 Claims, 4 Drawing Sheets

(51) Int. Cl.
　　　*H01R 13/646*　　(2011.01)
　　　*H04B 1/03*　　　(2006.01)
　　　*H04B 7/0413*　　(2017.01)
　　　*H05K 7/20*　　　(2006.01)
　　　*H05K 9/00*　　　(2006.01)

(52) U.S. Cl.
　　　CPC ............. *H04B 7/0413* (2013.01); *H05K 7/20* (2013.01); *H05K 9/0024* (2013.01)

(58) Field of Classification Search
　　　CPC ........ H04B 1/03; H04B 7/0413; H04B 17/00; H05K 7/20; H05K 9/0024
　　　See application file for complete search history.

(56) References Cited

U.S. PATENT DOCUMENTS

| | | | | |
|---|---|---|---|---|
| 2007/0149251 | A1* | 6/2007 | Jeon | H01Q 3/267 |
| | | | | 455/562.1 |
| 2015/0156818 | A1* | 6/2015 | Kim | H01Q 21/26 |
| | | | | 455/561 |

FOREIGN PATENT DOCUMENTS

| | | |
|---|---|---|
| KR | 10-2014-0019717 A | 2/2014 |
| KR | 10-2014-0088761 A | 7/2014 |

* cited by examiner

ANTENNA ASSEMBLY AND DEVICE INCLUDING ANTENNA ASSEMBLY

CROSS-REFERENCE TO RELATED APPLICATIONS

This application is a continuation application of International Application No. PCT/KR2018/003841, filed on Apr. 2, 2018, which claims priority and benefits of Korean Application No. 10-2017-0042127, filed on Mar. 31, 2017, the content of which is incorporated herein by reference in their entirety.

TECHNICAL FIELD

The present disclosure in some embodiments relates to an antenna device and an antenna assembly. More particularly, the present disclosure relates to a wireless communication antenna device and an antenna assembly used therein.

BACKGROUND

Wireless communication technology, for example, multiple-input multiple-output (MIMO) technology is a spatial multiplexing technique for dramatically enhancing the data transmission capacity by using a plurality of antennas, in which a transmitter transmits different data via the respective transmitting antennas and a receiver detects the transmitted different data through appropriate signal processing.

Therefore, the greater the numbers of transmit antennas as well as the receive antennas, the greater channel capacity is obtained to allow more data to be transmitted. For example, a ten-fold increase of antennas secures about 10 times the channel capacity of a current single-antenna system using the same frequency band.

4G LTE-advanced uses up to 8 antennas. The current pre-5G phase sees the development of products with 64 or 128 antennas with 5G phase coming up to expectedly use a much larger number of antennas, which is called massive MIMO technology. While the current cell operation is 2-dimensional, the massive MIMO technology will be available with the introduction of 3D-beamforming, which could then be called a full dimensional or FD-MIMO.

Massive MIMO technology takes more antennas accompanied by increased numbers of transmitters and filters. Still, lease costs of an installation space or space constraints render making of smaller, lighter, and cheaper RF components (antenna/filter/power amplifier/transceiver, etc.) to be the decisive factor in the success or failure of an antenna device employing the massive MIMO technology. To expand coverage of massive MIMO requires high power for causing power consumption and heat generation to work against the efforts to reduce the antenna weight and size.

DISCLOSURE

Technical Problem

The present disclosure in some embodiments seeks to provide an antenna device having a configuration that can efficiently radiate heat.

Further, the present disclosure in some embodiments aims to provide a MIMO antenna assembly having a compact and lightweight stacked structure and an antenna device including the same.

SUMMARY

At least one aspect of the present disclosure provides an antenna assembly and an antenna device including the same. The antenna assembly includes a plurality of antenna elements, a first printed circuit board (PCB), a plurality of cavity filters, and a second PCB. The first PCB has one surface provided with the plurality of antenna elements. The plurality of cavity filters are installed on the other surface of the first PCB and are electrically connected to the plurality of antenna elements. The second PCB has one surface electrically connected to the plurality of cavity filters and includes at least a power amplifier, a digital processing circuit, and a calibration network. Here, the second PCB includes one or more first processing areas and one or more second processing areas extending in parallel with each other. The digital processing circuit is disposed in the second processing area and not in the first processing area. The power amplifier is disposed in the first processing area and not in the second processing area.

Other means for solving problems than those described above may be reasoned out by other description of the present specification.

REFERENCE NUMERALS

Figure 1:
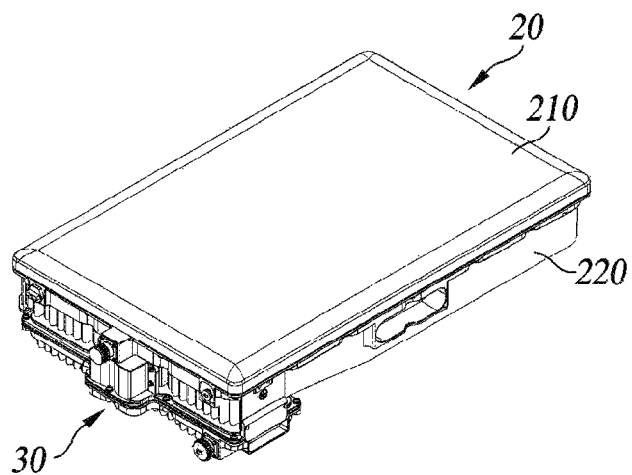
FIG. 1 is a front perspective view of an antenna device according to at least one embodiment of the present disclosure.

| | |
|---|---|
| 10: antenna assembly | 20: antenna body |
| 110: antenna element | 210: radome |
| 120: first PCB | 220: heat sink |
| 130: filter | 230: body housing |
| 140: second PCB | 30: power supply module |

DETAILED DESCRIPTION

Hereinafter, some embodiments of the present disclosure will be described in detail with reference to the accompanying drawings. In the following description, like reference numerals designate like elements, although the elements are shown in different drawings. Further, in the following description of some embodiments, a detailed description of known functions and configurations incorporated therein will be omitted for the purpose of clarity and for brevity.

FIG. 1 is a front perspective view of an antenna device according to at least one embodiment of the present disclosure.

An antenna device according to at least one embodiment includes an antenna assembly 10, an antenna body 20, and a power supply module 30.

An antenna device according to at least one embodiment is a kind of energy conversion and consumption device for converting electrical energy into wireless transmission and reception radio waves, and the energy conversion and consumption involve a considerable amount of heat generation. Overheat inside the body housing at the wireless transmission/reception module will significantly shorten the service life of the device. In addition, as the temperature of the wireless transmission/reception module increases, the sensitivity of the wireless transmission/reception module may vary. In particular, the temperature deviation at different positions of the wireless transmission/reception modules may generate a sensitivity deviation for each wireless transmission/reception module. The sensitivity variation the temperature of the wireless transmission/reception module or positional sensitivity deviation may not only impair the transmission/reception accuracy of the antenna device, but also leads to a reduced transmission/reception speed. In order to resolve the above issues, the present disclosure provides a massive MIMO antenna with the stacked structure having an advantage in the size and weight of the antenna device, and provides the massive MIMO antenna that is capable of efficient heat generation. These advantages can be achieved by the structure of the antenna assembly and the configuration of the PCB which is part of the configuration constituting the antenna assembly, so this specification will first outline a configuration of the antenna device and a stacked structure of the antenna assembly, and then describe a configuration of the PCB which forms the antenna assembly.

Figure 2:
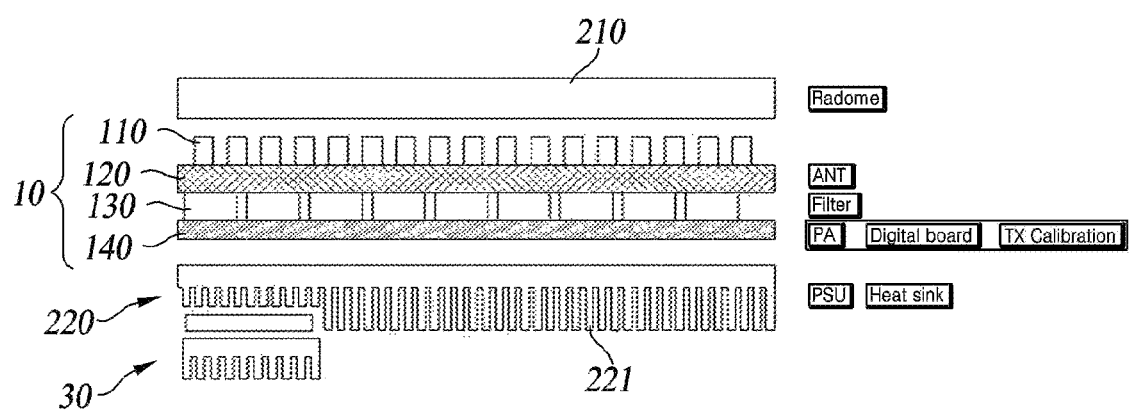
FIG. 2 is a schematic diagram of a stacked structure of a massive MIMO antenna system according to at least one embodiment of the present disclosure.

FIG. 2 is a diagram of a stacked structure of a massive MIMO antenna system according to at least one embodiment of the present disclosure.

Figure 3:
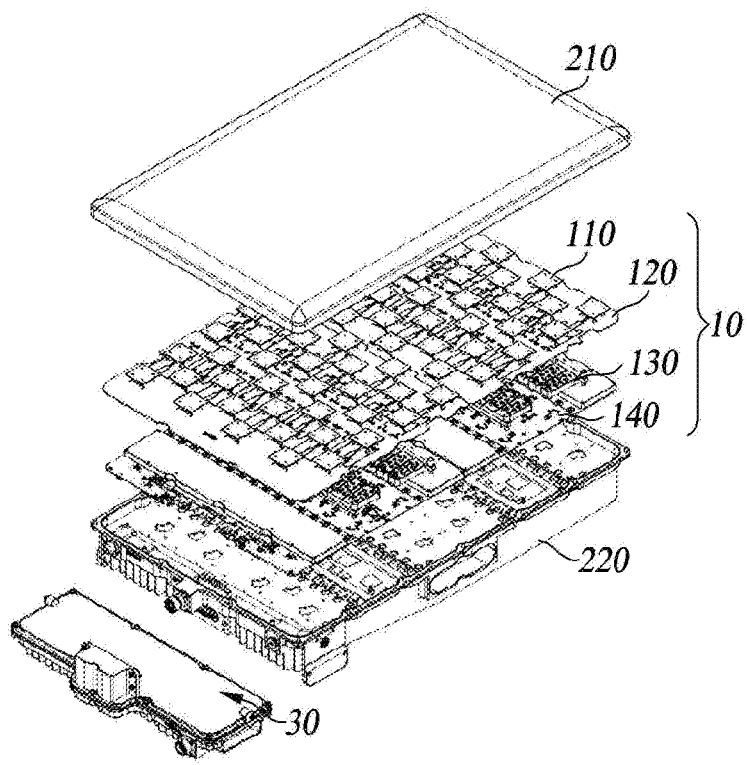
FIG. 3 is an exploded view of a massive MIMO antenna employing the stacked structure of FIG. 2, according to at least one embodiment of the present disclosure.
Figure 4:
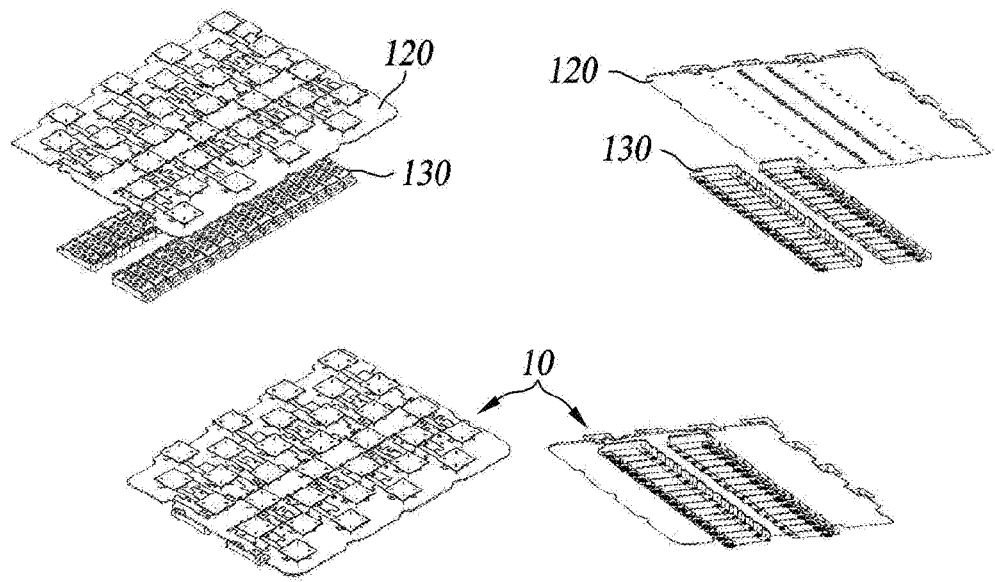
FIG. 4 is an exploded view of a sub-assembly in which filters are coupled to a first PCB coupled with an antenna element, according to at least one embodiment of the present disclosure.

FIG. 3 is an exploded view of a massive MIMO antenna employing the stacked structure of FIG. 2, according to at least one embodiment of the present disclosure. FIG. 4 is an exploded view of a subassembly in which filters 130 are coupled to a first PCB 120 with antenna elements 110 coupled thereto according to at least one embodiment of the present disclosure. Meanwhile, the filter 130 used in the present disclosure may be a cavity filter 130 as an example.

In FIG. 2, the antenna body 20 is represented by an illustrative configuration of a massive MIMO antenna. The antenna body 20, which is a massive MIMO antenna, has a radome 210, an externally disposed heat dissipation means 220 such as heat sink 220 formed with heat dissipation fins 221, and an interposed antenna assembly 10. The antenna assembly 10 may be configured to have digital elements implemented into modules which are then combined in a stacked structure.

Specifically, the stacked structure according to the exemplary embodiment of FIG. 2 is configured to have a first PCB 120 with a plurality of antenna elements coupled, filters 130 electrically connected to signal lines of the first PCB 120 and those of a second PCB 140, at least one digital processing circuit, at least one analog processing circuit forming a power amplifier, wherein the second PCB 140 includes at least one calibration network. In a stacked structure according to at least one embodiment, shown in FIG. 2, the calibration network is formed on a single board along with the power amplifier and the digital processing circuit, and therefore no RF cable connection is required between the power amplifier, the calibration network, the digital processing circuit, and the filters 130. In addition, the stacked structure of FIG. 2 is composed of fewer layers compared to the prior art.

This structure obviates the need for the RF connector to connect between the filters 130 and the PCB, which is advantageous that the size of the antenna assembly is reduced efficiently. In contrast, the conventional antenna assembly structure has the calibration network usually composed of a plurality of switches and disposed between antenna elements 110 and the filter 130, with an RF coupler coupled to one end of each filter 130. This requires the power supply network and the filters 130 to be connected through the RF connectors, resulting in increased weight and size. In addition, this hinders reducing the weight and size because the analog board formed with the power amplifier and the digital board are configured in separate layers which are respectively interconnected through RF connectors. Further, in such a structure, a large number of devices may be integrated on a single PCB, resulting in high integration density, which may cause heat generation problems. However, the stacked structure of the MIMO system according to at least one embodiment of the present disclosure shown in FIG. 2 is advantageous in terms of size and weight, and further advantageous in terms of heat generation by reducing the density of devices integrated on a single PCB. This can be further maximized by replacing the interface connector of the digital signal processing unit with a PCB pattern and replacing the RF interface connectors with a surface contact method on the PCB pattern. In other words, the above advantages can be maximized by forming the digital processing circuit and the calibration network as the PCB pattern on the second PCB 140 and configuring the second PCB 140 and the filters 130 to be connected in a surface contact manner.

The advantage of the stacked structure of the Massive MIMO antenna system according to at least one embodiment of the present disclosure shown in FIG. 2 can be more prominent from a special layout that employs at least one PCB, for example, the second PCB 140 for efficiently placing all of a transceiver circuit, a power amplifier, a calibration network and a digital processing circuit in distinctive areas. This special layout takes into account the heat generated due to increased integration density by the integration of many devices on a single PCB, taking advantage of the heat dissipation techniques that eliminate the heat generated. Specifically, the PCB may be the second PCB 140, the above advantages can be achieved by one or more first processing area and the second processing area arranged in parallel with each other on the second PCB 140.

The following will describe in detail a special layout on a single PCB according to at least one embodiment.

Figure 5:
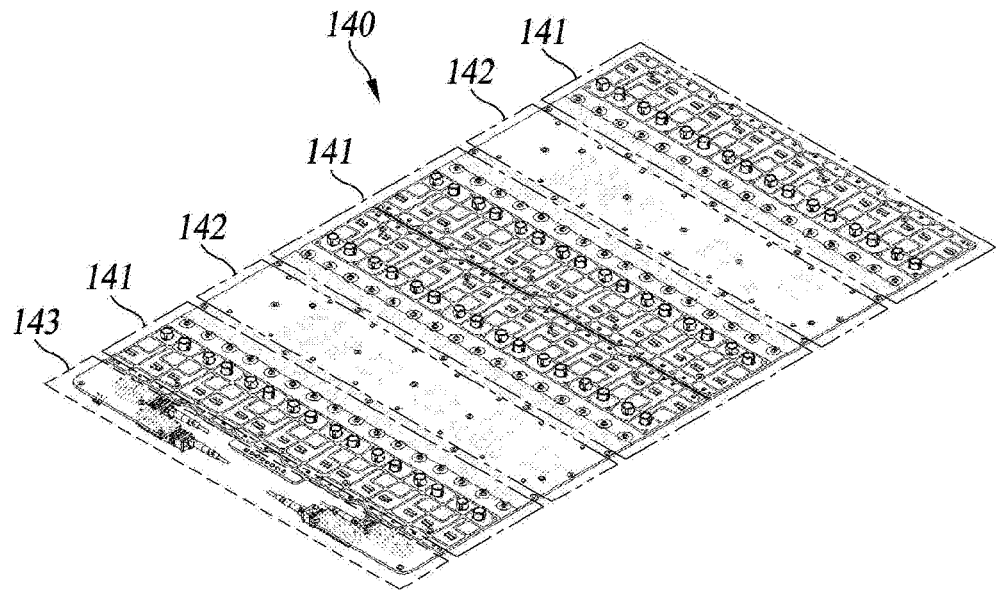
FIG. 5 is a perspective view of a layout of devices on a second PCB according to at least one embodiment of the present disclosure.

FIG. 5 is a perspective view of a device layout on a single PCB according to at least one embodiment of the present disclosure.

As shown in FIG. 5, a substrate of PCB according to at least one embodiment includes a port area 143, at least one first processing area 141, and at least one second processing area 142.

The port area 143 may be disposed at at least one end of the PCB. In at least one embodiment, ports installed in the port area 143 may be optical ports. However, the present disclosure is not limited thereto, and the ports may be digital signal terminals or analog signal terminals for transmitting and receiving digital signals or analog signals with an external device.

The port area 143 may extend along at least one substrate edge. In an example, the port area 143 may extend along some edges of the first processing area 141 or the second processing area 142.

Hereinafter, a direction parallel to at least one substrate edge on which the port area 143 is formed or a direction in which the port area 143 extends is collectively referred to as a 'transverse direction'.

Thus, in at least one embodiment of the disclosure, the port area 143 extends transversely at at least one edge of the substrate of PCB.

In addition, hereinafter, 'an area extending in a direction' means that the area has a rectangular shape which is elongated lengthwise with respect to a certain width, and the longitudinal direction of the area which is rectangular is parallel to a certain direction.

In this specification, the first processing area 141 refers to a circuit area installed with at least one power amplifier as well as an area free of a digital processing circuit. In addition, the second processing area 142 refers to a circuit area installed with at least one digital processing circuit as well as an area free of a power amplifier. However, the present disclosure include a range of equivalent structures that the first processing area 141 has a small number of digital processing circuits disposed therein and the second processing area 142 has features related to a small number of power amplifier.

In at least one embodiment of the present disclosure, the first processing area 141 is a circuit area installed with not only power amplifiers but also analog processing circuits (transceiver circuits) for providing a plurality of transmit/receive (TX/RX) circuits and at least one calibration network.

In at least one embodiment, cavity filters may be electrically connected to the PCB through the first processing area 141. For example, the cavity filters may be electrically connected to the PCB at the first processing area 141 through pin contact terminals formed in the first processing area 141.

In at least one embodiment of the disclosure, the first processing area 141 may extend transversely. In other words, the first processing area 141 may extend in a direction parallel to at least one substrate edge of the PCB on which the port area 143 is formed.

The second processing area 142 may be a circuit area in which digital processing circuits are installed. The digital processing circuit may include a circuit configuration of an IC chip for digital signal processing and its relevant elements. The first processing area 141 and the second processing area 142 may exhibit a difference in heat generation amount.

In sum, at least one embodiment of the present disclosure defines an area on a single PCB as the first processing area 141 where transceiver circuits, calibration networks, and power amplifiers are arranged in groups, and defines an area on a single PCB as the second processing area 142 where digital processing circuits are arranged in groups.

However, the present disclosure is not limited to this. Further, the components included may well be interchangeable between the first processing area 141 and the second processing area 142.

The second processing area 142 may be electrically connected to the elements of the first processing area 141 through, for example, circuit wiring provided in the second PCB 140.

In at least one embodiment of the disclosure, the second processing area 142 may extend transversely. In other words, the second processing area 142 may extend in a direction parallel to at least one edge of the substrate of second PCB, on which the port area 143 is formed.

In the illustrated embodiment, for example, there are three first processing areas 141, one of which may be disposed adjacent to the port area 143.

In addition, in the illustrated embodiment, the second processing areas 142 may be disposed between the first processing areas 141. In other words, in at least one embodiment of the present disclosure, the first processing area 141 and the second processing area 142 may be alternately arranged.

According to this embodiment of the present disclosure, the alternate arrangement of the circuits of the first processing areas 141 and the second processing areas 142 extending transversely prevents a local concentration of heat generated by the power amplifiers of the circuits of the first processing areas 141. In addition, as an example, the second processing area 142 circuits, which may generate relatively little heat, perform a kind of heat absorption and heat sink function for the first processing area 141 circuits, thereby enhancing cooling performance of the substrate of PCB.

Figure 6:
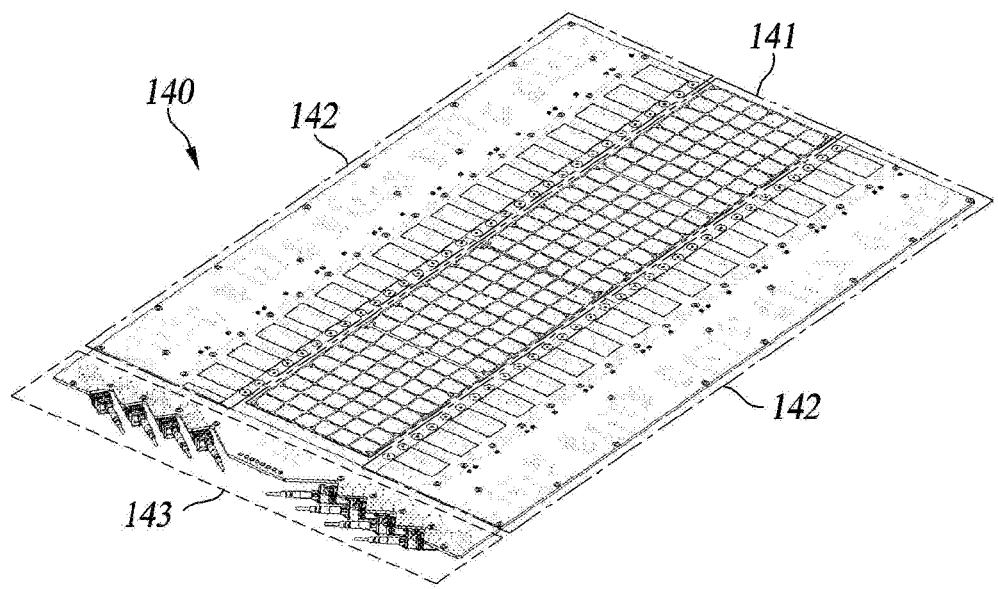
FIG. 6 is a perspective view of a layout of devices on a second PCB according to another embodiment of the present disclosure.
Figure 7:
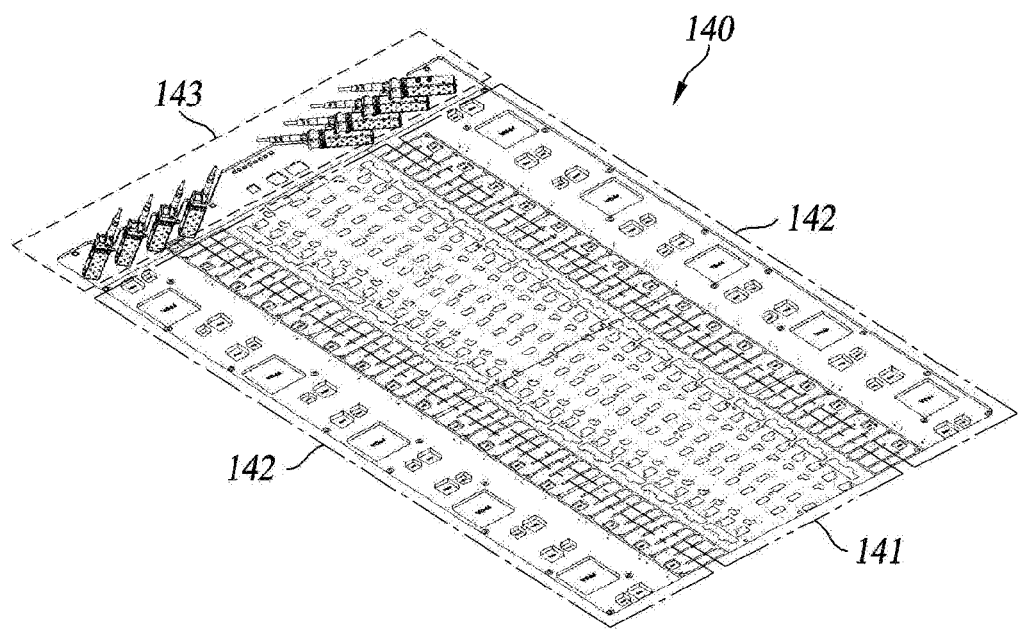
FIG. 7 is a perspective view of a layout of devices on a second PCB according to yet another embodiment of the present disclosure.

FIG. 6 and FIG. 7 are perspective views of device layouts on a single PCB according to embodiments of the present disclosure.

The illustrated layout in FIG. 5 has a structural effect that the amount of heat generated by the power amplifiers can be accumulated upward, but some system performance requirements might pose an issue.

For example, signal distortion may happen when the power amplifiers are centrally concentrated so that the heat generation is concentrated in the center, and when the dispersion of the digital processing circuits causes such signal flow that a large number of digital high-speed signals is processed through the internal PCB layers for the power amplifiers.

As shown in FIG. 6, a PCB according to another embodiment of the present disclosure includes a port area 143, a first processing area 141, and at least one second processing area 142. In this case, the PCB may be, for example, the second PCB 140 of the stacked structure of the illustrative massive MIMO antenna system shown in FIG. 2. The PCB according to another embodiment of the present disclosure has the first processing area 141 and the second processing area 142 that differ in terms of direction and structure from those of the PCB according to the at least one embodiment described with reference to FIG. 5. Hereinafter, a description will be given with reference to FIG. 6 concentrating on the difference of layout on the PCB areas of another embodiment from that of the at least one embodiment described above in FIG. 5. Redundant description will be omitted.

In another embodiment of the disclosure, the port area 143 extends along at least one substrate edge.

In another embodiment of the present disclosure, the first processing area 141 extends in the longitudinal direction.

Hereinafter, the longitudinal direction refers to a direction perpendicular to the transverse direction, that is, a direction perpendicular to at least one substrate edge of the PCB on which the port area 143 is formed.

In another embodiment of the present disclosure, the second processing area 142 also extends in the longitudinal direction.

In another embodiment illustrated, the at least one second processing area 142 is disposed at at least one of two long sides adjacent to an edge formed at one end of the PCB on which the port area 143 is formed.

In addition, the first processing area 141 may be disposed between two second processing areas 142.

In another embodiment of the present disclosure, at least one end of the second processing area 142 may be disposed adjacent to an edge formed at one end of the port area 143. As a result, the second processing area 142 may be directly wired to external signal transmission ports, for example, optical ports of the port area 143.

Thus, an electrical signal path may be established, running through the port area 143 and the second processing area 142, leading to the first processing area 141. In addition, such electrical signal paths or wiring arrangements need no other bypass paths, for example, cross-layer wiring structures through vias, thereby reducing the number of layers in the PCB.

In the device layout, that is, the horizontal layout, on a single PCB according to at least one embodiment described above with reference to FIG. 5, the digital processing circuit of the second processing area 142 when connecting to the port area 143 at, for example, optical ports needs wiring to bypass the first processing area 141, which bypass wiring requires to be bypassed, for example, across different layers of the multilayer PCB through vias. Such bypass wiring will increase the length and complexity of the transmission path, which may cause signal distortion in high-speed digital signal processing.

In contrast, another embodiment of the present disclosure shown in FIG. 6, that is, the longitudinal layout, can reduce the length and complexity of the transmission path to improve its electrical characteristics. Simplification of the wiring structure also has the advantage of increasing transmission accuracy and speed. In addition, according to this longitudinal layout, improvements can be achieved in the wiring design difficulty, productivity and cost reduction of the PCB.

In addition, according to another embodiment of the present disclosure, when the digital processing circuit of the second processing area 142 has a high complexity, the second processing area 142 may be a higher heat source than the first processing area 141. In this case, the second processing area 142 may have a relatively higher temperature than that of the first processing area 141.

In another embodiment of the disclosure, the second processing area 142 may be disposed at the edge of the PCB, wherein the edge area can make contact with the outside air or the body housing 230 and the heat sink 220 which are in contact with the outside air, by a wider area than the central area having the first processing area 141 can. This can enhance the heat dissipation of the second processing area 142 which can be heated to a relatively high temperature, and provide a uniform overall temperature distribution of the PCB.

On the other hand, unlike FIGS. 6 and 7, there may be a device layout on a PCB according to a further embodiment of the present disclosure. The device layout on a PCB according to a further embodiment is similar in configuration to the device layout on a PCB according to another embodiment of the present disclosure shown in FIG. 6 except that the first processing area 141 is different in placement from the second processing area 142. In other words, the device layout on a PCB according to a further embodiment differs from the device layout on a PCB according to another embodiment of the present disclosure shown in FIG. 6 in that they switch places between the first processing area 141 and the second processing area 142. The following will describe the difference between the layout on the PCB areas according to at least one embodiment and another embodiment of the present disclosure described above and the layout on the PCB areas according to a further embodiment of the present disclosure, omitting redundant descriptions.

In a further embodiment of the present disclosure, the port area 143 may extend along at least one substrate edge.

In a further embodiment of the present disclosure, at least one first processing area 141 and the second processing area 142 may extend in the longitudinal direction.

In a further embodiment of the present disclosure, the first processing areas 141 are disposed at two long sides, that is, two edges perpendicular to at least one edge of the PCB on which the port area 143 is formed.

In addition, the second processing area 142 may be disposed between the two first processing areas 141.

In a further embodiment of the present disclosure, at least one end of the second processing area 142 may be disposed adjacent to the port area 143. As a result, the second processing area 142 may be directly wired to external signal transmission ports, for example, optical ports of the port area 143. Of course, in this case, the first processing areas 141 may also be disposed adjacent to the port area 143.

Thus, an electrical signal path may be established, running through the port area 143 and the second processing area 142, leading to the first processing area 141. In addition, such electrical signal paths or wiring arrangements need no other bypass paths, for example, cross-layer wiring structures through vias, thereby reducing the number of layers in the PCB. The further embodiment of the present disclosure can reduce the length and complexity of the transmission path to provide the circuits with improved electrical characteristics. The device layout according to the further embodiment of the present disclosure is exemplary one assuming when the power amplifier is a relatively high heat generating source. In this case, the first processing areas 141 may be disposed at the edges of the PCB, wherein the edge areas can make contact with the outside air or the housing and the heat sink 220 which are in contact with the outside air, by a wider area than the central area having the second processing area 142 can. This can enhance the heat dissipation of the first processing area 141 which can be heated to a relatively high temperature, and provide a uniform temperature distribution of the entire PCB.

Figure 8:
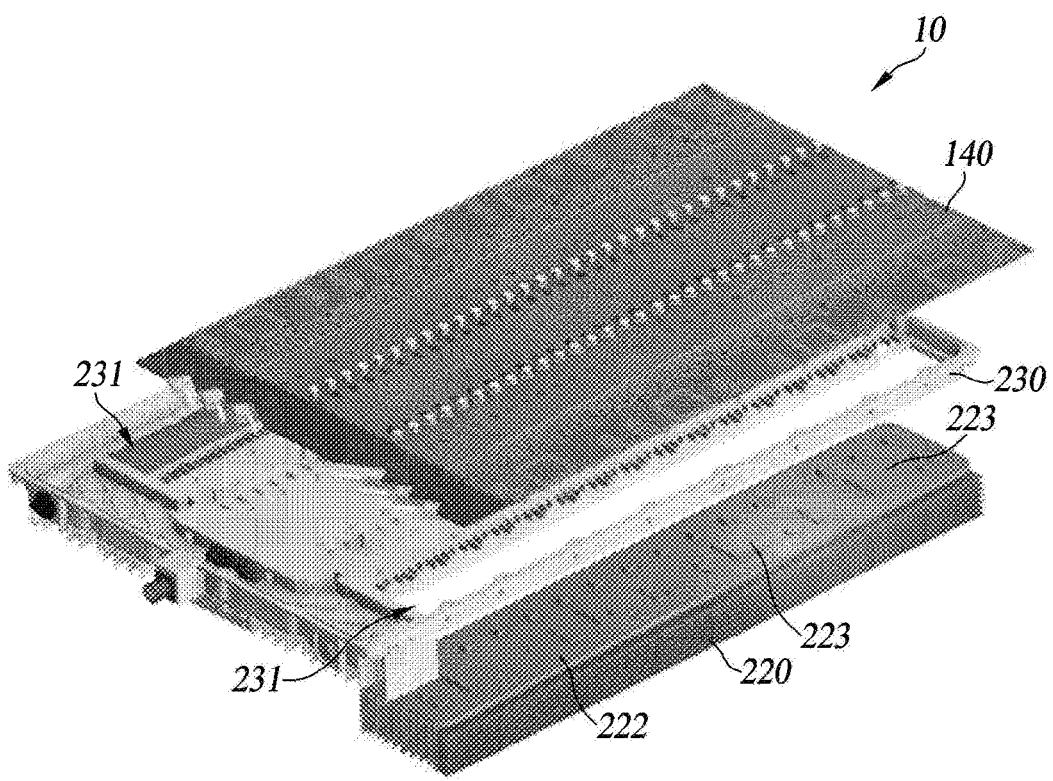
FIG. 8 is a partially coupled and partially exploded perspective view of a second PCB, a separate body housing 230, and a heat sink 220 according to yet further embodiment of the present disclosure.

FIG. 8 is a partially coupled and partially exploded perspective view of a second PCB, a separate body housing 230, and at least one heat sink 220 according to yet further embodiment of the present disclosure.

As shown in FIG. 8, in order to yet further improve the edge-side heat dissipation of the PCB according to the further embodiment of the present disclosure, a separate high-capacity heat sink 220 may be disposed, such as a detachable high-capacity heat sink 220 including heat dissipation fins 221. Here, the PCB to be heat dissipated may be, for example, the second PCB 140. In addition, as an example, the heat sink 220 that has a high thermal conductivity may be separately installed in the lower area of the PCB in order to improve heat dissipation characteristics of the edge-side second processing area 142 which is a relatively high heat source or the first processing area 141 when configured to be a high heat source. Specifically, the heat sink 220 may be formed of a material such as copper or aluminum having a higher thermal conductivity than that of the body housing 230.

For example, the heat sink 220 may be installed in the lower area of the second PCB 140. Specifically, the body housing 230 may be disposed under the second PCB 140, and the heat sink 220 may be disposed to be detachably disposed under the body housing 230. The heat sink 220 may be configured to be detachable. In addition, the heat sink 220 may include a heat sink body 222 and heat dissipation fins 221. The heat sink 220 may increase heat dissipation efficiency of the second PCB 140 by directly receiving heat generated from the second PCB 140 through at least one elongated groove 231. The elongated groove 231 formed in the main body housing 230 may be formed along both edge surfaces of the housing as an example, but is not limited thereto and may be formed in various arrangements. Heat generated from the second PCB 140 may be directly transferred to the heat sink 220 through the elongated groove 231 formed in the body housing 230. For example, either the first processing area 141 or the second processing area 142 may be a relatively high heat generating processing area and disposed at the edge sides of the second PCB 140, where the elongated grooves 231 may be formed in the body housing 230 under the second PCB 140. In addition, the detachable heat sinks 220 may be disposed under the edge sides of the second PCB 140 where the processing area that is a relatively high heat source is formed in the second PCB 140. Such arrangement for efficiently dissipating heat adjacent to a portion holding a high heat source provides a superior heat dissipation from the second PCB 140 and its surroundings. In this case, contact surfaces formed between the second PCB 140 and the heat sinks 220 can promote smoother heat radiation. For example, the heat sink 220 is formed on its upper surface with protrusions 223 which are in contact with a surface of the second PCB 140 to facilitate the heat radiation from the second PCB 140.

The heat sink 220 of high heat dissipation, which is installed separately, may be manufactured by a die casting or an extrusion process of a separate housing. Concentrating the heat dissipation performance in an area that causes a relatively high temperature allows to remove heat dissipation fins 221 from an area of relatively low heat source may be deleted or reduce the size of the heat dissipation fins 221. This can reduce the total volume and weight of the antenna device according to the present disclosure. On the other hand, when the first processing area 141 is a higher heat source than the second processing area 142, the first processing area 141 may be disposed on the edge side of the second PCB 140, and the heat sink 220 may be disposed under the edge side of the second PCB 140, on which the first processing area 141 is disposed. In other words, either the first processing area 141 or the second processing area 142 may be the processing area that is a relatively high heat source and disposed at the edge sides of the second PCB 140, under which the heat sinks 220 may be disposed. In addition, the separate heat sink 220 may be disposed on the bottom surface of the second PCB 140 to be extending in a direction perpendicular to the direction in which the first processing area 141 and the second processing area 142 extend. In this case, the separate heat sink 220 is disposed across the area formed in the first processing area 141 and the second processing area 142 at the edge side of the second PCB 140, thereby promoting the heat dissipation from the first processing area 141 and the second processing area 142. As an alternative, the heat sink 220 may be disposed on the entire lower surface of the second PCB 140 as long as the layout allows.

Furthermore, the heat sink 220 having a high heat dissipation characteristic, which is separately installed, may change its size and structure to meet heat dissipation characteristics required according to product features and output. For example, the length of the heat dissipation fin 221 may be changed. Therefore, without changing the appearance of the product implemented by the present disclosure, heat dissipation characteristics can be provided to meet the output requirements. In addition, the heat sink 220 may be integral or detachable. When the heat sink 220 is detachable, it can be replaced with another heat sink 220 appropriate to the characteristics or output of the product.

In addition, the separate high heat dissipation heat sink 220 may include one or more contact recesses. The contact recess may be in contact with the rear surface of the PCB, for example, in contact with the rear surface of the area encompassing the high heat generating elements of the second processing area 142.

This can immediately and externally dissipate local heat generated by a high heat generating element, for example, an FPGA or a dynamic signal processing chip of the second processing area 142, resulting in a uniform temperature distribution on the PCB.

The contact recesses employed can directly radiate or extract the local heat generations in the working elements, which increases the heat dissipation efficiency of the separate high heat dissipation fins 221 or the heat sink 220, thereby reducing the size and weight of the heat dissipation fins 221 or the heat sink 220 for the entire system.

Although exemplary embodiments of the present disclosure have been described for illustrative purposes, those skilled in the art will appreciate that various modifications, additions and substitutions are possible, without departing from the idea and scope of the claimed invention. Therefore, exemplary embodiments of the present disclosure have been described for the sake of brevity and clarity. The scope of the technical idea of the present embodiments is not limited by the illustrations. Accordingly, one of ordinary skill would understand the scope of the claimed invention is not to be limited by the above explicitly described embodiments but by the claims and equivalents thereof.

The invention claimed is:

1. An antenna assembly comprising:
   a plurality of antenna elements;
   a first printed circuit board (PCB) having one surface provided with the plurality of antenna elements;
   a plurality of cavity filters installed on other surface of the first PCB and electrically connected to the plurality of antenna elements; and
   a second PCB having one surface electrically connected to the plurality of cavity filters and including at least a power amplifier, a digital processing circuit, and a calibration network, wherein
   the second PCB includes one or more first processing areas and one or more second processing areas extending in parallel with each other,
   the digital processing circuit is disposed in the second processing area and not in the first processing area, and
   the power amplifier is disposed in the first processing area and not in the second processing area, and
   wherein the first processing area and the second processing area are parallel to each other, and
   wherein the first processing area and the second processing area are disposed on a same plane.

2. The antenna assembly of claim 1, further comprising a port area formed to extend along some edges of the first processing area and the second processing area,
   wherein the first processing area and the second processing area extend in a direction perpendicular to an edge formed at one substrate edge on which the port area is formed, and one edge of each of the first processing area and the second processing area is disposed adjacent to the edge formed at one substrate end on which the port area is formed.

3. The antenna assembly of claim 1, further comprising a port area formed to extend along one edge of the first processing area,
wherein the first processing area and the second processing area extend in a direction parallel to a direction in which the port area extends, the first processing area is disposed adjacent to an edge formed at one substrate end on which the port area is formed.

4. The antenna assembly of claim 2, wherein the first processing areas and the second processing areas are alternately arranged.

5. The antenna assembly of claim 1, wherein the digital processing circuit and the calibration network are formed in a PCB pattern on the second PCB, and
wherein the second PCB and the cavity filters are connected in a surface contact manner.

6. The antenna assembly of claim 5, wherein the second processing area is connected to the port area by direct circuit wiring.

7. An antenna device comprising:
an antenna assembly comprising:
a plurality of antenna elements;
a first printed circuit board (PCB) having one surface provided with the plurality of antenna elements;
a plurality of cavity filters installed on other surface of the first PCB and electrically connected to the plurality of antenna elements; and
a second PCB having one surface electrically connected to the plurality of cavity filters and including at least a power amplifier, a digital processing circuit, and a calibration network,
wherein the second PCB includes one or more first processing areas and one or more second processing areas extending in parallel with each other,
the digital processing circuit is disposed in the second processing area and not in the first processing area, and
the power amplifier is disposed in the first processing area and not in the second processing area;
a main housing formed with at least one elongated groove and disposed on a bottom surface of the second PCB of the antenna assembly; and
a detachable heat sink disposed on a bottom surface of the main body housing and having a heat sink main body and at least one heat dissipation fin,
wherein the detachable heat sink is configured to receive heat generated from the second PCB through the elongated groove.

8. The antenna device of claim 7, wherein a relatively high heat generating processing area that is either the first processing area or the second processing area is disposed on an edge side of the second PCB, and
wherein the main body housing is formed with an elongated groove and the detachable heat sink is disposed in a common lower area of the edge side of the second PCB where the relatively high heat generating processing area is formed.

9. The antenna device of claim 7, further comprising:
at least one protrusion which is formed on an upper surface of the heat sink body of the detachable heat sink and is in contact with a bottom surface of the second PCB to directly receive heat transmitted from the second PCB.

10. The antenna device of claim 7, wherein the detachable heat sink is made of a material having a higher thermal conductivity than the body housing.

* * * * *